(12) United States Patent
Yamamoto

(10) Patent No.: US 7,349,034 B2
(45) Date of Patent: Mar. 25, 2008

(54) TELEVISION TUNER USING INTEGRATED CIRCUIT

(75) Inventor: Masaki Yamamoto, Fukushima-ken (JP)

(73) Assignee: Alps Electric Co., Ltd, Tokyo (JP)

( * ) Notice: Subject to any disclaimer, the term of this patent is extended or adjusted under 35 U.S.C. 154(b) by 510 days.

(21) Appl. No.: 10/991,566

(22) Filed: Nov. 17, 2004

(65) Prior Publication Data

US 2005/0110908 A1    May 26, 2005

(30) Foreign Application Priority Data

Nov. 21, 2003    (JP)    ............................. 2003-272656

(51) Int. Cl.
 H04N 5/44    (2006.01)
 H04N 5/50    (2006.01)
(52) U.S. Cl. ...................... 348/731; 348/732; 348/733; 348/725; 455/179.1; 455/195.1
(58) Field of Classification Search ................ 348/731, 348/732, 733, 725, 730; 455/179.1, 193.2, 455/209, 315, 180.1, 180.2, 195.1; 334/47, 334/18, 28
See application file for complete search history.

(56) References Cited

U.S. PATENT DOCUMENTS

| | | | | |
|---|---|---|---|---|
| 4,499,495 A | * | 2/1985 | Strammello | .................. 348/731 |
| 4,771,332 A | * | 9/1988 | Metoki | ........................ 348/731 |
| 4,905,306 A | * | 2/1990 | Anderson | ................ 455/191.3 |
| 5,428,828 A | * | 6/1995 | Pugel et al. | ............. 455/191.2 |
| 5,737,035 A | * | 4/1998 | Rotzoll | ....................... 348/725 |
| 6,064,866 A | * | 5/2000 | Lange | ...................... 455/180.1 |
| 6,177,964 B1 | * | 1/2001 | Birleson et al. | ............ 348/725 |
| 6,342,928 B1 | * | 1/2002 | Ohira | .......................... 348/729 |
| 6,392,715 B1 | * | 5/2002 | Sato et al. | ................... 348/731 |
| 6,842,198 B2 | * | 1/2005 | Suzuki et al. | ............... 348/731 |
| 6,904,271 B2 | * | 6/2005 | Yamamoto | ............... 455/180.4 |
| 6,914,639 B2 | * | 7/2005 | Yamamoto et al. | ......... 348/731 |
| 7,019,790 B2 | * | 3/2006 | Yamamoto | .................. 348/725 |
| 7,030,939 B2 | * | 4/2006 | Yamamoto | .................. 348/731 |
| 7,139,039 B2 | * | 11/2006 | Yamamoto | .................. 348/731 |
| 7,196,738 B2 | * | 3/2007 | Yamamoto | .................. 348/731 |
| 2003/0112377 A1 | * | 6/2003 | Kawamura et al. | ......... 348/731 |

FOREIGN PATENT DOCUMENTS

| | | |
|---|---|---|
| JP | 2003-234971 | 8/2003 |
| JP | 3100017 | 12/2003 |

* cited by examiner

*Primary Examiner*—David Ometz
*Assistant Examiner*—Jean W. Désir
(74) *Attorney, Agent, or Firm*—Brinks Hofer Gilson & Lione

(57) ABSTRACT

An integrated circuit is provided with a power supply terminal and an external circuit connecting terminal which is DC insulated from an internal high-frequency circuit and is connected to an external circuit. An interface is provided with an address identifying circuit having applied with an address identifying voltage corresponding to address data and for setting the interface to receive only channel selection data by the address identifying voltage. The address identifying circuit is connected to the external circuit connecting terminals, and a first resistor is connected between the power supply terminal and the external circuit connecting terminal. The external circuit connecting terminal is DC shorted to the ground, a second resistor is connected between the external circuit connecting terminal and the ground, or the external circuit connecting terminal is DC insulated from the ground.

5 Claims, 4 Drawing Sheets

TELEVISION TUNER USING INTEGRATED CIRCUIT

This application claims the benefit of priority to Japanese Patent Application No. 2003-272656, filed on Nov. 21, 2003, herein incorporated by reference.

BACKGROUND OF THE INVENTION

1. Field of the Invention

The present invention relates to a television tuner using an integrated circuit.

2. Description of the Related Art

A conventional television tuner will be described with reference to FIG. 5. An integrated circuit 10 has two sides opposite to each other, and each side has twelve terminals (each number inside circles representing terminals indicates a terminal number in the figure).

Terminal Nos. 1 to 12 are provided on one side 10a, and terminal Nos. 13 to 24 are provided on the other side 10b. Further, as schematically illustrated in the figure, a plurality of circuits is provided inside the integrated circuit, and the respective circuits are connected to the terminals provided on both sides 10a and 10b. In the respective circuits, balanced-input terminals of a UHF mixing circuit 11 are connected to the terminal Nos. 23 and 24, and a non-balanced input terminal of a VHF mixing circuit 12 is connected to the terminal No. 22. Further, balanced-output terminals of the UHF mixing circuit 11 and the VHF mixing circuit 12 are connected to the terminal Nos. 19 and 20, respectively.

Local oscillating signals are supplied from two oscillating circuits, that is, a VHF low-band oscillating circuit (hereinafter, referred to as a low-band oscillating circuit) 13 and a VHF high-band oscillating circuit (hereinafter, referred to as a high-band oscillating circuit) 14 to the VHF mixing circuit 12. The low-band oscillating circuit 13 is a non-balanced type circuit, and a resonance circuit coupling terminal thereof is connected to the terminal No. 1. Further, the high-band oscillating circuit 14 is a balanced type circuit, and two resonance circuit coupling terminals thereof are connected to the terminal Nos. 2 and 3, respectively. Local oscillating signals from a UHF oscillating circuit 15 are supplied to the UHF mixing circuit 11. The UHF oscillating circuit 15 is also a balanced type circuit, and two resonance circuit coupling terminals thereof are connected to the terminal Nos. 4 and 5, respectively.

Channel selection data is input from a television receiver body (not shown) to the terminal Nos. 14 to 16. More specifically, frequency data for channel selection or band switching data (referred to as channel selection data) is input to the terminal No. 14, and a clock signal is input to the terminal No. 15. In addition, a voltage for identifying an address (address identifying voltage) is applied to the terminal No. 16. These clock signal and channel selection data are input to a PLL circuit 17 and a switching voltage generating circuit 18 through an interface 16.

The address identifying voltage allows only the channel selection data among various types of data output from the television receiver body to be input to the integrated circuit 10. The address identifying voltage is set corresponding to 2-bit address data included in the channel selection data. For example, when the address data is specified as (1, 0), the address identifying voltage is set in the range of from 2V to 3V. This voltage is set by diving a source voltage of 5V by a voltage dividing resistor (not shown) provided at the outside of the integrated circuit, and the divided voltage is applied to the terminal No. 16.

An address identifying circuit (not shown) to which the address identifying voltage is input is provided in the interface 16. The address identifying circuit sets the interface to receive only the channel selection data.

Frequency data and local oscillating signals output from the respective oscillating circuits 13, 14, and 15 are input to the PLL circuit 17. An error signal output from the PLL circuit 17 is DC converted by a charge pump 20 having a low-pass filter. Then, a tuning voltage is output from a tuning voltage generating circuit 21 to the terminal No. 10.

Further, band switching data is input to the switching voltage generating circuit 18, and a band switching voltage is output to the terminal Nos. 17 and 18.

Peripheral circuits provided at the outside of the integrated circuit are connected to the integrated circuit 10. A first resonance circuit 28 is utilized when receiving a low-band signal in a VHF band. One terminal thereof is coupled to the terminal No. 1, and the other terminal thereof is connected to the ground. Further, a second resonance circuit 29 is utilized when receiving a high-band signal in the VHF band. One terminal thereof is connected to the terminal No. 2, and the other terminal thereof is connected to the terminal No. 3. Furthermore, a third resonance circuit 30 is utilized when receiving a UHF band signal. One terminal thereof is connected to the terminal No. 4, and the other terminal is connected to the terminal No. 5. Varactor diodes (not shown) for changing a resonance frequency are provided in the respective resonance circuits 28, 29, and 30. The tuning voltage output from the terminal No. 10 is applied to the respective varactor diodes, (for example, see Japanese Unexamined Patent Application Publication No. 2003-234971 (FIG. 1)).

Further, with respect to circuits (circuits provided at the inside and at the outside of the integrated circuit 10) connected to terminals other than the above-mentioned terminals, a description thereof will be omitted.

In the above-mentioned construction, since a dedicated terminal (terminal No. 16) is provided for applying the address identifying voltage generated at the outside of the integrated circuit, the number of terminals increases. Therefore, there is a limitation to reduce the size of the integrated circuit.

SUMMARY OF THE INVENTION

An object of the present invention is to effectively utilize a space inside the integrated circuit by decreasing the number of terminals in the integrated circuit and to reduce the size of the integrated circuit.

In order to achieve the object, a television tuner according to the present invention comprises an integrated circuit having a high-frequency circuit and an interface to which plural types of data including channel selection data are input therein; and an external circuit provided at the outside of the integrated circuit and coupled to the high-frequency circuit in high-frequency wise. In the television tuner, address data for specifying the integrated circuit overlaps the channel selection data, and the integrated circuit is provided with a power supply terminal to which a power supply voltage is applied and an external circuit connecting terminal insulated from the high-frequency circuit in direct-current wise and connected to the external circuit. In addition, the interface is provided with an address identifying circuit having applied with an address identifying voltage corresponding to the address data and for setting the interface to receive only the channel selection data by the address identifying voltage. The address identifying circuit is connected to the external circuit connecting terminal, and a first resistor is connected between the power supply terminal and the external circuit connecting terminal. Further, the external circuit connecting terminal is DC shorted to the ground, a second resistor is connected between the external circuit connecting terminal and the ground, or the external circuit connecting terminal is DC insulated from the ground in direct-current wise.

Further, the second resistor is provided at the outside of the integrated circuit.

Furthermore, the external circuit is a resonance circuit which constitutes an oscillating circuit together with the high-frequency circuit. The resonance circuit is provided with at least an inductor whose one terminal is connected to the external circuit connecting terminal and the other terminal is AC connected to the ground, and the other terminal of the conductor is directly connected to the ground.

Moreover, the external circuit is a resonance circuit which constitutes an oscillating circuit together with the high-frequency circuit. The resonance circuit is provided with at least an inductor whose one terminal is connected to the external circuit connecting terminal and the other terminal is AC connected to the ground, and the other terminal of the inductor is connected to the ground through a second resistor.

Further, the external circuit is a resonance circuit which constitutes an oscillating circuit together with the high-frequency circuit. The resonance circuit is provided with at least an inductor whose one terminal is connected to the external circuit connecting terminal and the other terminal is AC connected to the ground, and the other terminal of the inductor is DC insulated from the ground.

DESCRIPTION OF THE PREFERRED EMBODIMENT

Figure 1:
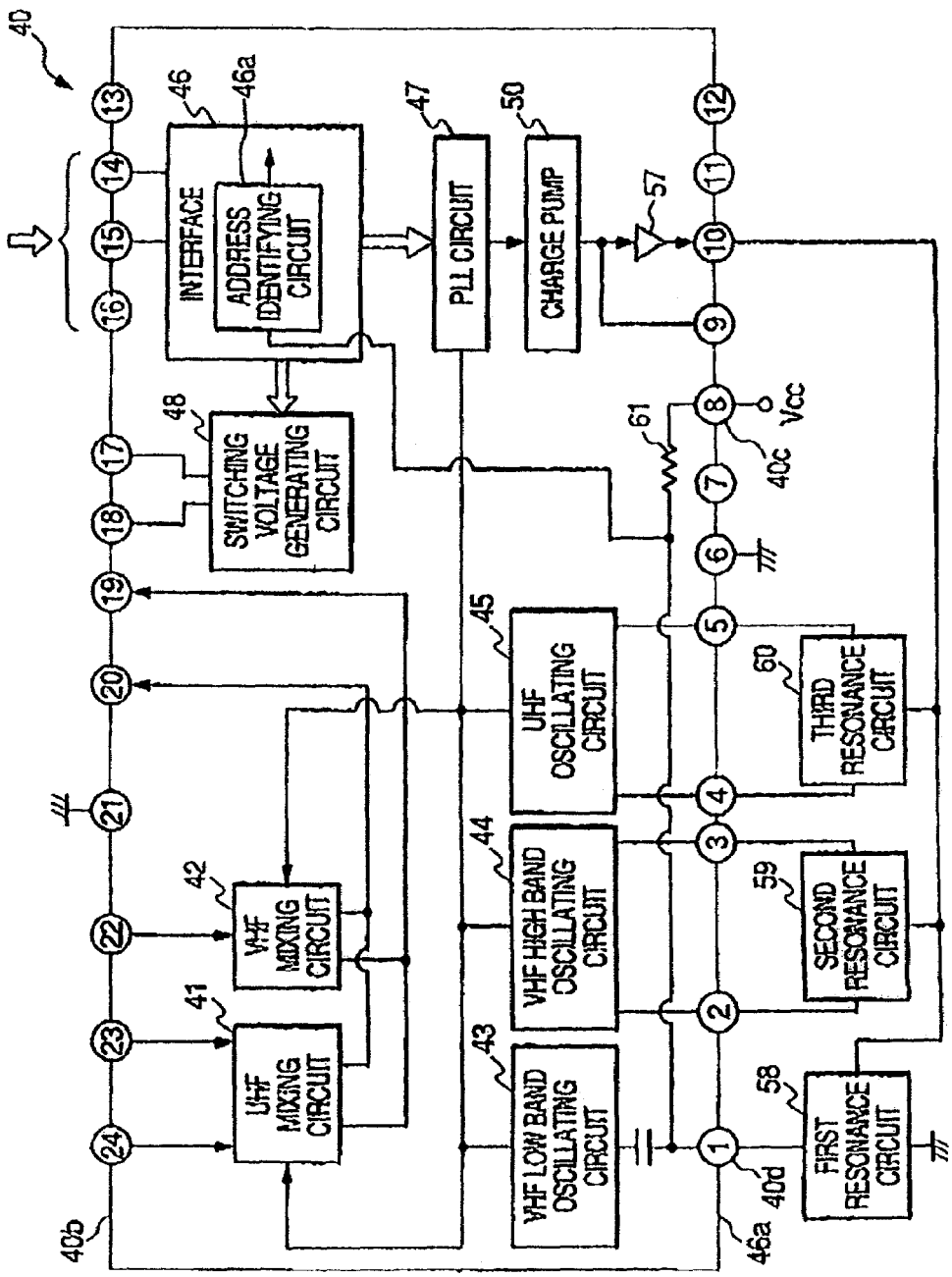
FIG. 1 is a circuit diagram illustrating a construction of a television tuner according to the present invention.

A television tuner according to the present invention will now be described with reference to FIG. 1. An integrated circuit 40 has two sides opposite to each other, and each side has twelve terminals (each number inside circles representing terminals indicates a terminal number in the figure).

Terminal Nos. 1 to 12 are provided on one side 40*a*, and terminal Nos. 13 to 24 are provided on the other side 40*b*. Further, as schematically illustrated in FIG. 1, a plurality of high-frequency circuits is provided inside the integrated circuit, and the respective high-frequency circuits are connected to the terminals provided on both sides 40*a* and 40*b*. In the plurality of high-frequency circuits, balanced-input terminals of a UHF mixing circuit 41 are connected to the terminal Nos. 23 and 24, and a non-balanced input terminal of a VHF mixing circuit 42 is connected to the terminal No. 22. Further, balanced-output terminals of the UHF mixing circuit 41 and the VHF mixing circuit 42 are connected to the terminal Nos. 19 and 20, respectively. Television signals selected by a tuning circuit (not shown) are input to the mixing circuits 41 and 42, respectively.

Further, local oscillating signals from two high-frequency oscillating circuits, that is, a VHF low-band oscillating circuit 43 and a VHF high-band oscillating circuit 44 are supplied to the VHF mixing circuit 42. The VHF low-band oscillating circuit 43 is a non-balanced type circuit, and a resonance circuit coupling terminal thereof is AC connected to the terminal No. 1. Further, the VHF high-band oscillating circuit 44 is a balanced-type circuit, and two resonance circuit coupling terminals thereof are coupled to the terminal Nos. 2 and 3, respectively. Local oscillating signals from one high-frequency oscillating circuit, that is, a UHF oscillating circuit 45 are supplied to the UHF mixing circuit 41. The UHF oscillating circuit 45 is also a balanced-type circuit, and two oscillating circuit coupling terminals thereof are coupled to the terminal Nos. 4 and 5, respectively.

Plural types of data from a television receiver body (not shown) are input to the terminal No. 14, and channel selection data transmitted toward the integrated circuit 40 is included in the plural types of data. Further, 2-bit address data for specifying the integrated circuit 40 is included in the channel selection data, in addition to frequency data for channel selection and band switching data.

Further, a clock signal is input to the terminal No. 15.

These channel selection data and clock signal are input to a PLL circuit 47 and a switching voltage generating circuit 48 through an interface 46, respectively. An address identifying circuit 46*a* is provided in the interface 46. The address identifying circuit 46*a* sets the interface such that only the channel selection data among the plural types of data transmitted from the television receiver body can be input to the integrated circuit 40. Therefore, an address identifying voltage corresponding to address data is applied to the address identifying circuit 46*a*.

The relationship between the address data and the address identifying voltage is established as follows. For example, when the address data is specified to (0, 0), the address identifying voltage is set to 0 V to 0.5 V. When the address data is specified to (1, 0), the address identifying voltage is set to 2.0 V to 3.0 V. When the address data is specified to (1, 1), the address identifying voltage is set to 4.5 V to 5.0 V (power supply voltage).

The frequency data and the local oscillating signals output from the respective oscillating circuits 43, 44, and 45 are input to the PLL circuit 47. An error signal output from the PLL circuit 47 is DC converted by a charge pump 50 having a low-pass filter, and then a tuning voltage from a tuning voltage generating circuit 51 is input to the terminal No. 10.

Further, the band switching data is input to the switching voltage generating circuit 48, and a band switching voltage is output to the terminal Nos. 17 and 18.

Furthermore, a power supply voltage Vcc (for example, 5 V) is applied to a power supply terminal (terminal No. 8) 40*c* and is then supplied to the respective high-frequency circuits therefrom.

External circuits are connected to the integrated circuit 40. Among them, a first resonance circuit 58 is utilized when receiving a low-band signal in a VHF band. One terminal thereof is coupled to an external circuit connecting terminal (terminal No. 1) 40*d*, and the other terminal thereof is AC connected to the ground. In addition, the low-band oscillating circuit 43 and the first resonance circuit 58 constitute a VHF low-band oscillating circuit.

Further, a second resonance circuit 59 is utilized when receiving a high-band signal in a VHF band. One terminal thereof is connected to the terminal No. 2, and the other terminal thereof is connected to the terminal No. 3. In addition, the high-band oscillating circuit 44 and the second resonance circuit 59 constitute a VHF high-band oscillating circuit.

Furthermore, a third resonant circuit 60 is utilized when receiving a UHF band signal. One terminal thereof is connected to the terminal No. 4, and the other terminal is connected to the terminal No. 5. In addition, the UHF oscillating circuit 45 and the third resonance circuit 60 constitute a UHF oscillating circuit.

A first resistor 61 is connected between the power supply terminal (terminal No. 8) 40c and the external circuit connecting terminal (terminal No. 1) 40d to which the first resonance circuit 58 is connected, and the external circuit connecting terminal (terminal No. 1) 40d is connected to an input terminal of the address identifying circuit 46a.

A varactor diode for changing a resonance frequency and an inductor connected in parallel to the varactor are provided in the respective resonance circuits 58, 59, and 60, and the tuning voltage output from the terminal No. 10 is applied to the respective varactor diodes.

Further, with respect to circuits (high-frequency circuits provided at the inside of the integrated circuit 40 and external circuits provided at the outside of the integrated circuit 40) connected to terminals other than the above-described terminals, the description thereof will be omitted.

Figure 2:
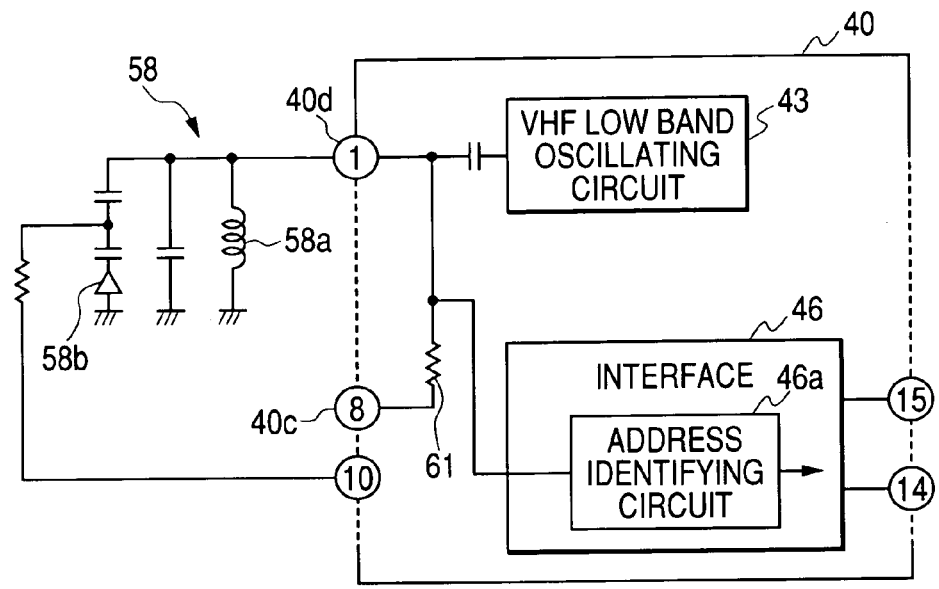
FIG. 2 is an explanatory view illustrating the generation of an address identifying voltage in the television tuner according to the present invention.

For example, when the address data for specifying the integrated circuit 40 is (0, 0), the address identifying voltage to be input to the address identifying circuit 46a is 0V to 0.5V. In this case, as shown in FIG. 2, one terminal of the inductor 58a of the first resonance circuit 58 is connected to the external circuit connecting terminal (terminal No. 1) 40d, and the other terminal thereof is connected to the ground, such that the external circuit connecting terminal (terminal No. 1) 40d is DC shorted to the ground. In this way, the voltage of the external circuit connecting terminal (terminal No. 1) 40d becomes 0V, and this voltage is input to the address identifying circuit 46a as an address identification voltage, such that the above-mentioned condition (0V to 0.5V) is satisfied. Further, an anode of the varactor diode 58b connected in parallel to the inductor 58a is connected to the ground, and a tuning voltage is applied to a cathode thereof.

Figure 3:
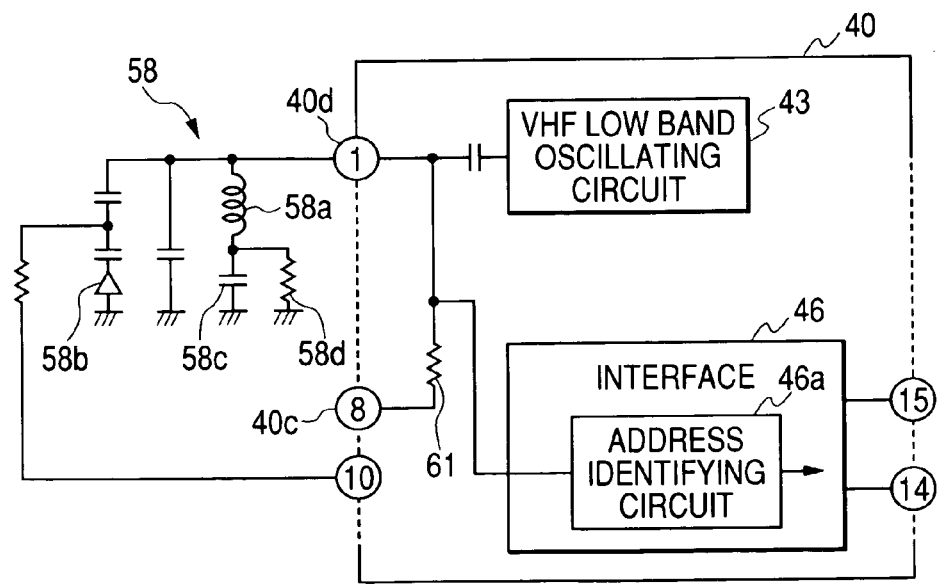
FIG. 3 is an explanatory view illustrating the generation of the address identifying voltage in the television tuner according to the present invention.

Further, when the address data for specifying the integrated circuit 40 is (1, 0), the address identifying voltage to be input to the address identifying circuit 46a is 2.0V to 3.0V. In this case, as shown in FIG. 3, one terminal of the inductor 58a of the first resonance circuit 58 is connected to the external circuit connecting terminal (terminal No. 1) 40d, and the other terminal thereof is AC connected to the ground by a direct current blocking capacitor 58c and is also connected to the ground through a second resistor 58d. Then, the resistance value of the second resistor 58d is made to be equal to that of the first resistor 61. By doing so, the voltage of the external circuit connecting terminal (terminal No. 1) 40d becomes 2.5V, and this voltage is input to the address identifying circuit 46a as an address identifying voltage, such that the above-mentioned condition (2.0 to 3.0V) is satisfied.

Figure 4:
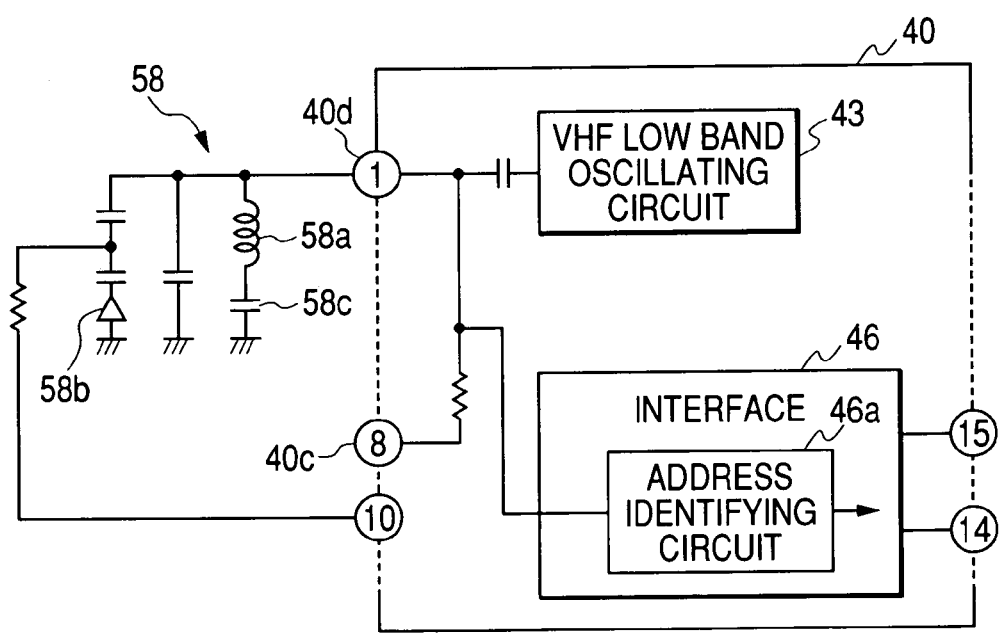
FIG. 4 is an explanatory view illustrating the generation of the address identifying voltage in the television tuner according to the present invention.
Figure 5:
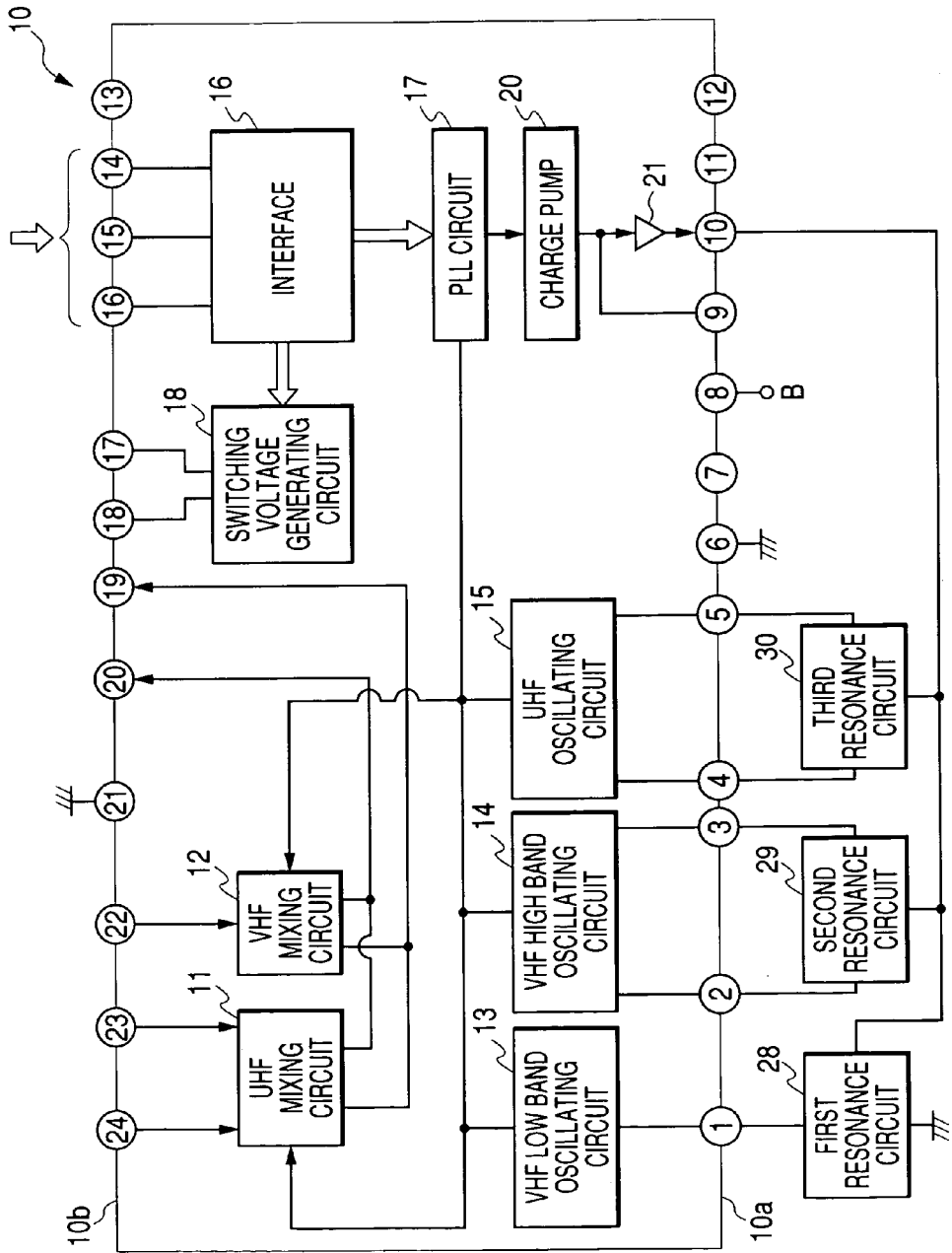
FIG. 5 is a circuit diagram illustrating a construction of a conventional television tuner.

Furthermore, when the address data for specifying the integrated circuit 40 is (1, 1), the address identifying voltage to be input to the address identifying circuit 46a is 4.5V to 5.0V. In this case, as shown in FIG. 4, one terminal of the inductor 58a of the first resonance circuit 58 is connected to the external circuit connecting terminal (terminal No. 1) 40d, and the other terminal thereof is connected to the ground only through the direct-current blocking capacitor 58c to be DC insulated from the ground. By doing so, the voltage of the terminal No. 1 becomes 5.0V, and this voltage is input to the address identifying circuit 46a as an address identifying voltage, such that the above-mentioned condition (4.5V to 5.0V) is satisfied.

As described above, according to the present invention, the integrated circuit is provided with a power supply terminal to which a power supply voltage is applied and an external circuit connecting terminal insulated from the high-frequency circuit in direct-current wise and connected to the external circuit. The interface is provided with an address identifying circuit having applied with an address identifying voltage corresponding to the address data and for setting the interface to receive only the channel selection data by the address identifying voltage. The address identifying circuit is connected to the external circuit connecting terminal, and the first resistor is connected between the power supply terminal and the external circuit connecting terminal. The external circuit connecting terminal is shorted to the ground in direct-current wise, the second resistor is connected between the external circuit connecting terminal and the ground, or the external circuit connecting terminal is insulated from the ground in direct-current wise. Therefore, it is possible to apply three types of address identifying voltages to the address identifying circuit using the external circuit connecting terminal. Thus, a dedicated terminal for applying the address identifying voltage is not needed, and thus it is possible to reduce the size of the integrated circuit.

Further, the second resistor is provided at the outside of the integrated circuit. Therefore, it is possible to easily change the value of the address identifying voltage.

Furthermore, the external circuit is a resonance circuit which constitutes an oscillating circuit together with the high-frequency circuit. The resonance circuit is provided with at least an inductor whose one terminal is connected to the external circuit connecting terminal and the other terminal is connected to the ground in high-frequency wise, and the other terminal of the inductor is directly connected to the ground. Therefore, it is easy to generate an address voltage of 0 V by using the resonance circuit.

Moreover, the external circuit is a resonance circuit which constitutes an oscillating circuit together with the high-frequency circuit. The resonance circuit is provided with at least an inductor whose one terminal is connected to the external circuit connecting terminal and the other terminal is AC connected to ground, and the other terminal of the inductor is connected to the ground through the second resistor. Therefore, it is easy to generate an intermediate address voltage between 0V and the power supply voltage by using the resonance circuit.

Further, the external circuit is a resonance circuit that constitutes an oscillating circuit together with the high-frequency circuit. The resonance circuit is provided with at least an inductor whose one terminal is connected to the external circuit connecting terminal and the other terminal is AC connected to the ground, and the other terminal of the inductor is DC insulated from the ground. Therefore, it is easy to generate an address voltage equal to the power supply voltage by using the resonance circuit.

What is claimed is:

1. A television tuner comprising:
an integrated circuit having a high-frequency circuit and an interface to which plural types of data including channel selection data are input therein; and
an external circuit provided at an outside of the integrated circuit and AC coupled to the high-frequency circuit,
wherein address data for specifying the integrated circuit overlaps the channel selection data,
wherein the integrated circuit is provided with a power supply terminal to which a power supply voltage is applied and an external circuit connecting terminal DC insulated from the high-frequency circuit and connected to the external circuit,
wherein the interface is provided with an address identifying circuit having applied with an address identifying voltage corresponding to the address data and for setting the interface to receive only the channel selection data by the address identifying voltage,
wherein the address identifying circuit is connected to the external circuit connecting terminal, and a first resistor is connected between the power supply terminal and the external circuit connecting terminal, and
wherein the external circuit connecting terminal is DC shorted to the ground, a second resistor is connected between the external circuit connecting terminal and the ground, or the external circuit connecting terminal is DC insulated from the ground.

2. The television tuner according to claim 1,
wherein the second resistor is provided at the outside of the integrated circuit.

3. The television tuner according to claim 1,
wherein the external circuit is a resonance circuit which constitutes an oscillating circuit together with the high-frequency circuit,
wherein the resonance circuit is provided with at least an inductor whose one terminal is connected to the external circuit connecting terminal and the other terminal is AC connected to the ground, and
wherein the other terminal of the conductor is directly connected to the ground.

4. The television tuner according to claim 2,
wherein the external circuit is a resonance circuit which constitutes an oscillating circuit together with the high-frequency circuit,
wherein the resonance circuit is provided with at least an inductor whose one terminal is connected to the external circuit connecting terminal and the other terminal is AC connected to the ground, and
wherein the other terminal of the inductor is connected to the ground through a second resistor.

5. The television tuner according to claim 1,
wherein the external circuit is a resonance circuit which constitutes an oscillating circuit together with the high-frequency circuit,
wherein the resonance circuit is provided with at least an inductor whose one terminal is connected to the external circuit connecting terminal and the other terminal is AC connected to the ground, and
wherein the other terminal of the inductor is DC insulated from the ground.

* * * * *